(12) United States Patent
Gordon et al.

(10) Patent No.: US 7,554,044 B2
(45) Date of Patent: Jun. 30, 2009

(54) SELF-CONFIGURING OPERATOR CONTROL

(75) Inventors: David Scott Gordon, Hillsboro, ND (US); Michael Ray Schlichtmann, Fargo, ND (US); Jon Thomas Jacobson, Fargo, ND (US)

(73) Assignee: Deere & Company, Moline, IL (US)

( * ) Notice: Subject to any disclaimer, the term of this patent is extended or adjusted under 35 U.S.C. 154(b) by 94 days.

(21) Appl. No.: 11/695,639

(22) Filed: Apr. 3, 2007

(65) Prior Publication Data

US 2008/0245646 A1 Oct. 9, 2008

(51) Int. Cl.
*H01H 9/00* (2006.01)

(52) U.S. Cl. .................... 200/5 R; 200/4; 200/296; 361/600; 307/10.1

(58) Field of Classification Search .......... 200/5 R, 200/553, 296, 293, 339, 4, 1 R; 361/600–832; 307/10.1, 10.8, 9.1, 112–139
See application file for complete search history.

(56) References Cited

U.S. PATENT DOCUMENTS

| 4,048,672 | A | 9/1977 | Seiden et al. |
| 6,837,725 | B1 | 1/2005 | Gordon et al. |
| 6,841,895 | B1 | 1/2005 | Kelwaski |
| 2001/0048247 | A1 | 12/2001 | Bae et al. |
| 2004/0154907 | A1 | 8/2004 | Blossfeld et al. |
| 2004/0245855 | A1 | 12/2004 | Bachle |
| 2006/0119570 | A1 | 6/2006 | Searle et al. |
| 2007/0052298 | A1 | 3/2007 | Merkel et al. |
| 2007/0062787 | A1 | 3/2007 | Miura et al. |

OTHER PUBLICATIONS

Ametek Dixson Product Information Note 072-40243, User Guide for the SmartGage Handheld Tool, Initial Release Date Feb. 25, 1998, Revision Date Jan. 1, 2007.
Chorded keyboard, Wikipedia, the free encyclopedia Website. Pages modified Jan. 1, 2008. [online]. [Retrieved on Jan. 24, 2008]. Retrieved from the Internet:<URL: http://en.wikipedia.org/wiki/Chorded_keyboard>.

*Primary Examiner*—Kyung Lee

(57) ABSTRACT

An operator control assembly including at least one operator control mounted in a panel cover or dashboard with at least one opening for receivably mounting the operator control, and at least one printed circuit board mounted beneath the panel cover. A unique configuration of projecting members on the bottom of the operator control comes in contract with and engages sensors mounted on the printed circuit board. Depending on the number and arrangement of the projecting members, a unique subset o sensors t engaged, providing a unique electronic ID for each operator control installed. This electronic ID can then be transmitted to an electronic control unit, which will alter its operation based on the types of operator controls currently installed.

7 Claims, 4 Drawing Sheets

SELF-CONFIGURING OPERATOR CONTROL

FIELD OF THE INVENTION

The present invention relates to an operator control assembly, and, more particularly, to a method and apparatus for the automatic identification of the function of an operator control.

BACKGROUND OF THE INVENTION

In commercial and utility vehicles, it is desirable to customize the features available to the operator based on the specific application for which the vehicle is being used. This can be done by offering different sets of electronics for each type of vehicle application, but this is an impractical approach for the vehicle manufacturer who must then maintain a large number of vehicle versions. A more effective approach is to offer a single set of electronics for all vehicle applications that can be reprogrammed with different versions of software. Although this is a vast improvement over using different electronics versions for each vehicle, it still requires a configuration step for each vehicle before the vehicle is shipped to the final customer and multiple versions of software.

One approach is to integrate electronic components into the operator controls in the vehicle. As different operator controls (such as switches) are populated in the vehicle during the assembly process, the vehicle system communicates with or detects the electronics resident in the operator controls to determine which vehicle features should be enabled or disabled. This allows the vehicle to be self-configuring based on the population of the operator controls, and eliminates the need for end-of-line programming specific to the vehicle application. This also allows the vehicle functionality to be changed by a service technician by replacing specific operator controls.

Unfortunately, adding electronics to each operator control can increase the cost of the overall system. An operator control such as a switch is typically a simple mechanical device, made primarily of an inexpensive plastic or similar material. Adding electronics to each control increases the cost and complexity of the controls. A typical dashboard in a commercial vehicle can have dozens of these switches, increasing the impact of using expensive switches with built-in electronics.

Intelligent vehicle gauges can be manufactured such that the plastic decal that is placed on the face of the gauge determines the identity and functionality of the underlying electronics driving the gauge. The plastic decal is manufactured such that it has a flexible tail extending out from the main decal body. The free end of this flexible tail contains a number of metallicized pads. When the tail is plugged into a corresponding connector on a circuit board beneath the decal, the metallicized pads come in contact with a series of small switches integral to the connector. Based on the number and arrangement of the metallicized pads, a subset of the switches is activated, providing an electronic identity for the gauge. The behavior of the gauge is determined by the mechanical presence and arrangement of pads on the tail of the decal. However, the assembly of the gauges requires special assembly instructions to insert the flexible tail into the corresponding connector.

U.S. Pat. No. 6,837,725 by Gordon et al. describes an electrical connector assembly which uses a specific arrangement of projecting members, or tabs, molded into the connector housing to activate a subset of switches placed on the circuit board to which the connector is joined. The number and location of the tabs is configurable. The selective activation of switches by the Connector tabs provides a unique electronic identity for the component. This patent describes an electrical connector assembly and does not pertain to operator controls.

What is needed in the art is an operator control that cap provide automatic configuration of a vehicle system using a simple mechanical Interface to an underlying electronic circuit board that is cost-effective and easy to configure.

SUMMARY OF THE INVENTION

Accordingly, an object of this invention is to provide an operator control assembly which includes features for communicating operator control identifying information to an electronic control unit.

A further object of the invention is to provide an operator control assembly which includes features by which different operator controls can be distinguished from each other.

A further object of the invention is to use the unique identity provided by the features of the operator control assembly to indicate to an electronic control unit how activations of the operator control should be interpreted.

These and other objects are achieved by the present invention, which includes an operator control such as a switch, knob, or joystick, a panel cover into which the operator control is mounted, and a printed circuit board mounted beneath the panel cover and mechanically interfacing with the operator control.

The operator control includes an operator control interface such as a switch cap which provides the visible outer surface of the operator control, a control mechanism which transfers the mechanical motion of the operator control interface to an underlying circuit board, and an operator control enclosure providing a number of mechanical extensions such as tabs on its bottom surface. The number and location of the mechanical extensions is configurable.

The printed circuit board contains a first set of sensors (functional sensors) such as electrical switches for detecting the movement of the control mechanism, and a second set of sensors (control D sensors) for detecting the presence and arrangement of the mechanical extensions on the bottom surface of the operator control enclosure.

The panel cover includes one or more depressions or cut-outs to hold operator controls, and mechanical features to hold the printed circuit board such that the operator control engages the functional and control ID sensors on the printed circuit board when it is inserted into the panel cover.

One or more operator controls are inserted into the cut-outs of the panel cover during the assembly process. When the operator controls are pushed down into the cut-outs in the panel cover, the mechanical extensions on the bottom surface of the operator control enclosure come in contact with and engage one or more of the control ID sensors on the printed circuit board. By varying the number and arrangement of the mechanical extensions on the bottom surface of the enclosure, a different operator control ID number can be generated on the printed circuit board based on the subset of control ID sensors activated. This identifying information can be communicated to and used by an electronic control unit on the vehicle to modify the behavior of the vehicles feature.

DESCRIPTION OF THE PREFERRED EMBODIMENT

Figure 1:
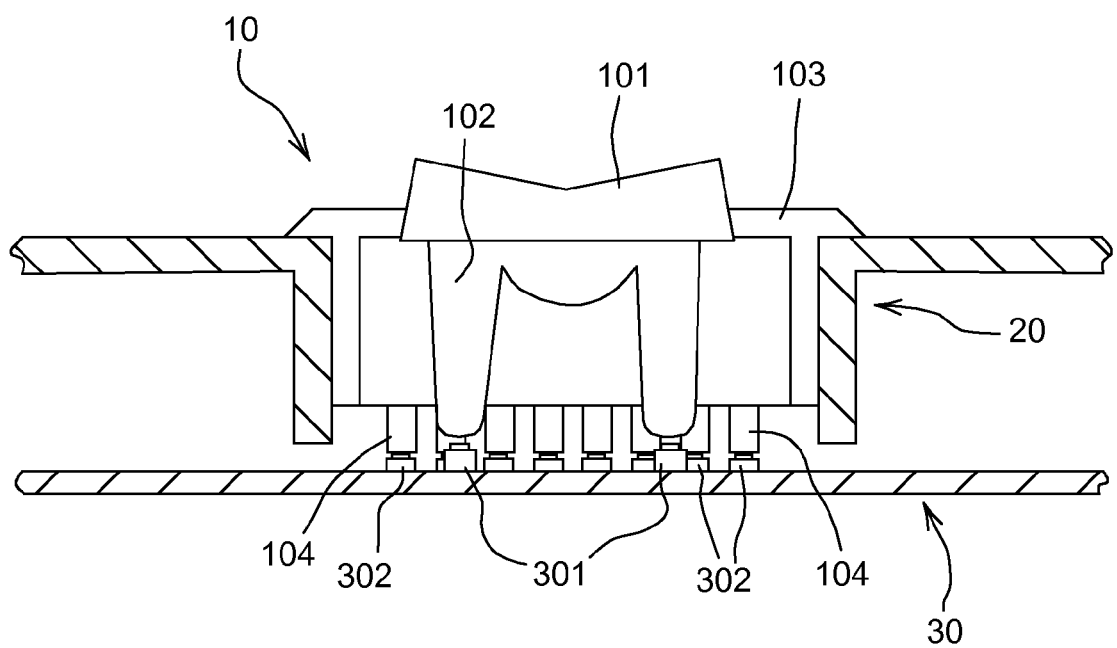
FIG. 1 is a cross-sectional view of an operator control as it is mounted into a panel cover according to the present invention.
Figure 2:
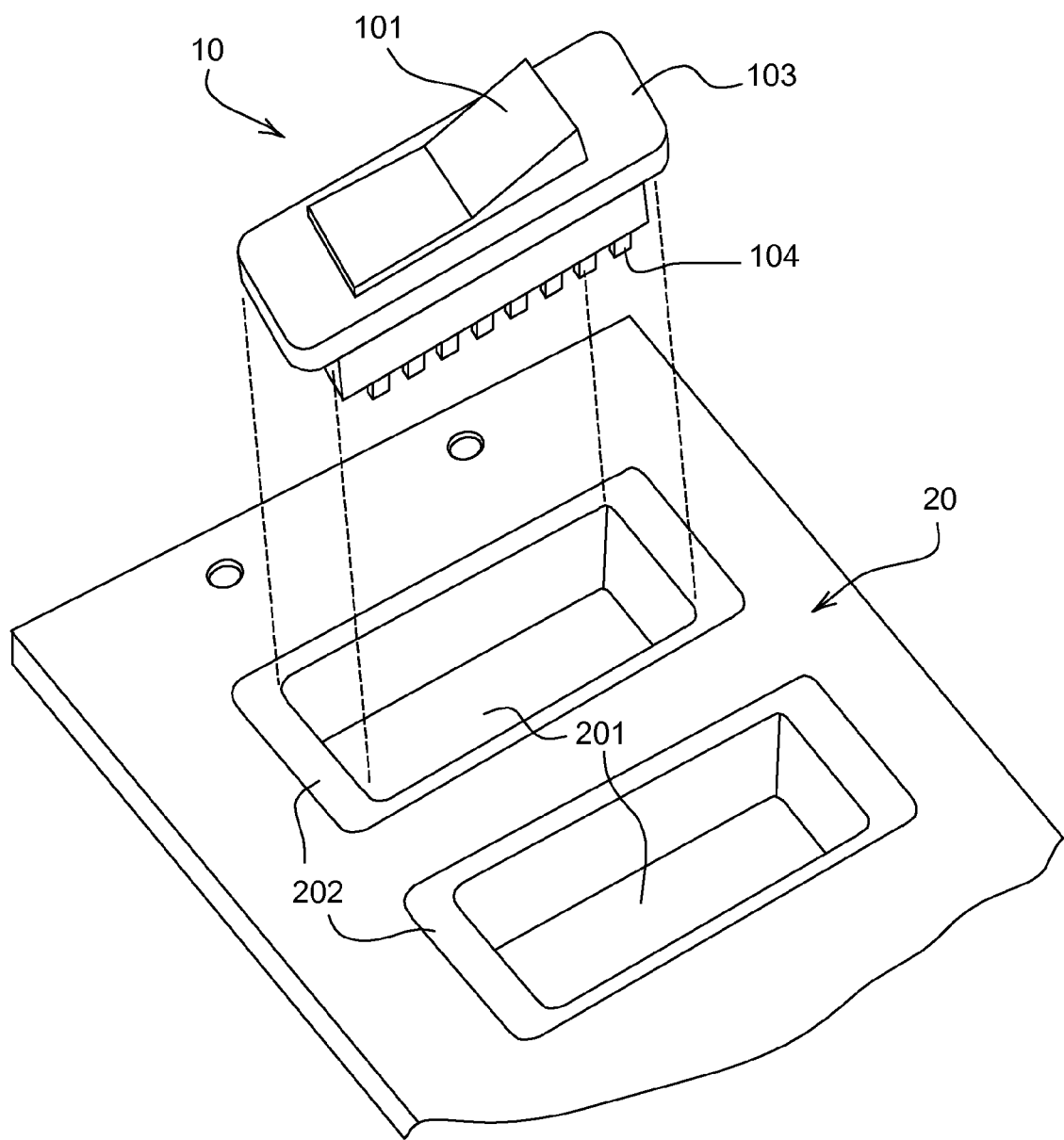
FIG. 2 is an exploded perspective view of the operator control and panel cover of FIG. 1.

Referring to FIG. 1 and FIG. 2, an operator control 10 includes an operator control interface 101 which is mounted in place on top of a control mechanism 102. The operator control interface 101 forms part of the outer visible surface of the operator control 10 and is the portion of the operator control 10 that the operator interacts with to engage the operator control 10. The operator control interface 101 may be the cap of a toggle switch as shown in FIG. 1 and FIG. 2, or it may be a different type of device such as the handle of a joystick, or other device. The control mechanism 102 and operator control interface 101 are housed in an operator control enclosure 103 which provides a mating surface to the panel cover 20. The control mechanism 102 is mounted inside the outer operator control enclosure 103 such that it can pivot, bend, or otherwise move in order to engage functional sensor 301 on a printed circuit board 30 Mounted beneath the panel cover 20. The functional sensors 301 detect the mechanical movement of the control mechanism 102 and send signals to a separate electronic module (not shown) which controls at least a portion of the vehicle or application in which the operator control 10 is mounted. The bottom surface of the operator control enclosure 103 features a series of projecting members 104.

The panel cover 20 is typically mounted in the dashboard of a vehicle (not shown) and offers one or more cut-outs 201, each of which can hold an operator control 10. Each cut-out 201 provides a mating surface 202 to hold and form a seal with the operator control enclosure 103 of the operator control 10. The panel cover 20 also protects the printed circuit board 30 upon which is mounted the functional sensors 301, the control ID sensors 302, and other electronics (not shown) as needed to process the activations of sensors 301 and 302.

Figure 3:
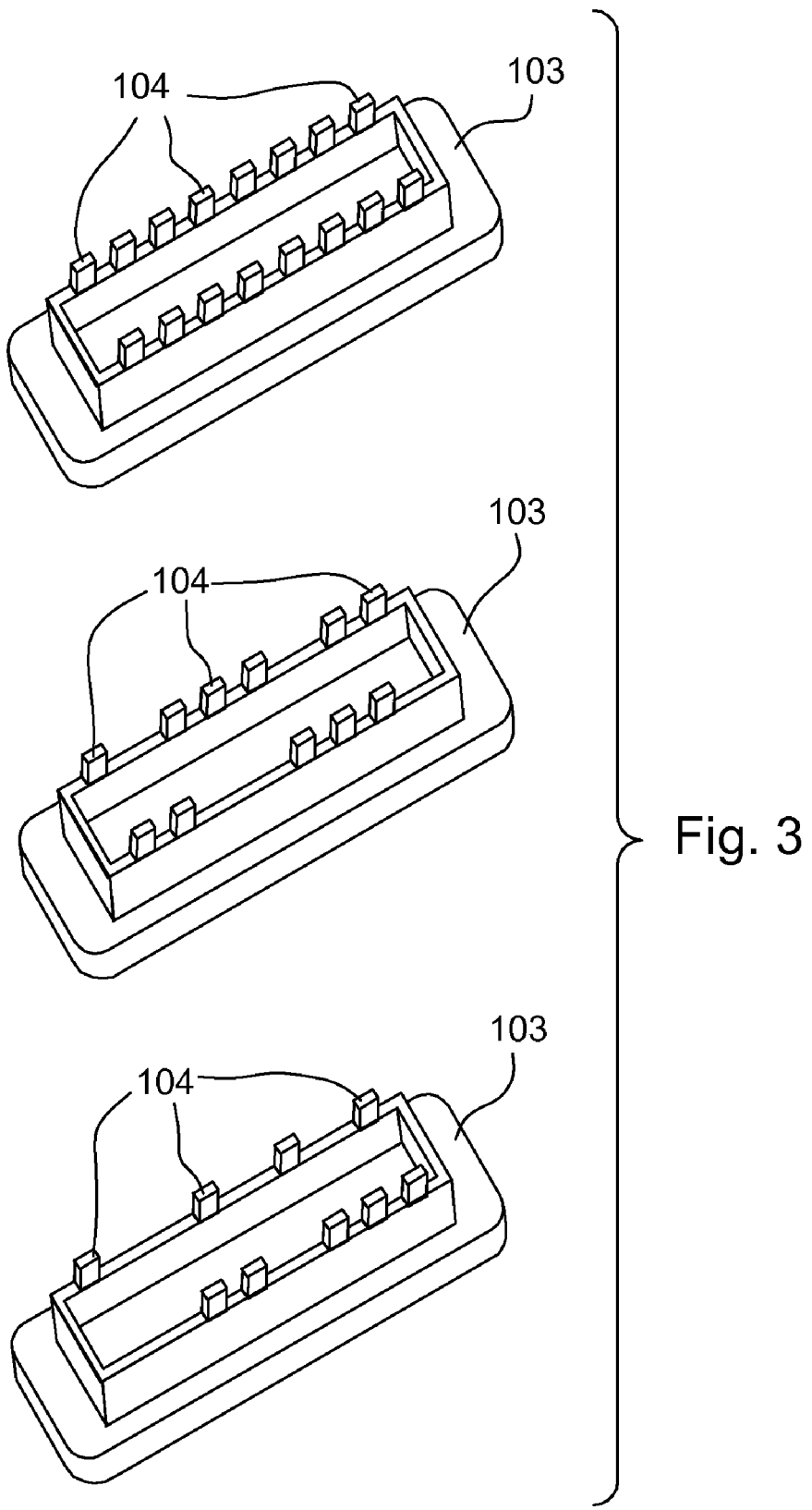
FIG. 3 is a bottom perspective view of variations of the operator control enclosure of FIGS. 1 and 2.

Referring to FIGS, 1, 2, and 3, the bottom surface of the operator control enclosure 103 features a series of projecting members 104. When the operator control 10 is installed in the panel cover 20, the operator manipulates the operator control interface 101, which in turn causes the underlying control mechanism 102 to move and engage the functional sensors 301 mounted on the printed circuit board 30. As shown in FIG. 3, the number and arrangement of the projecting members 104 on the bottom of the operator control enclosure 103 can be varied.

Figure 4:
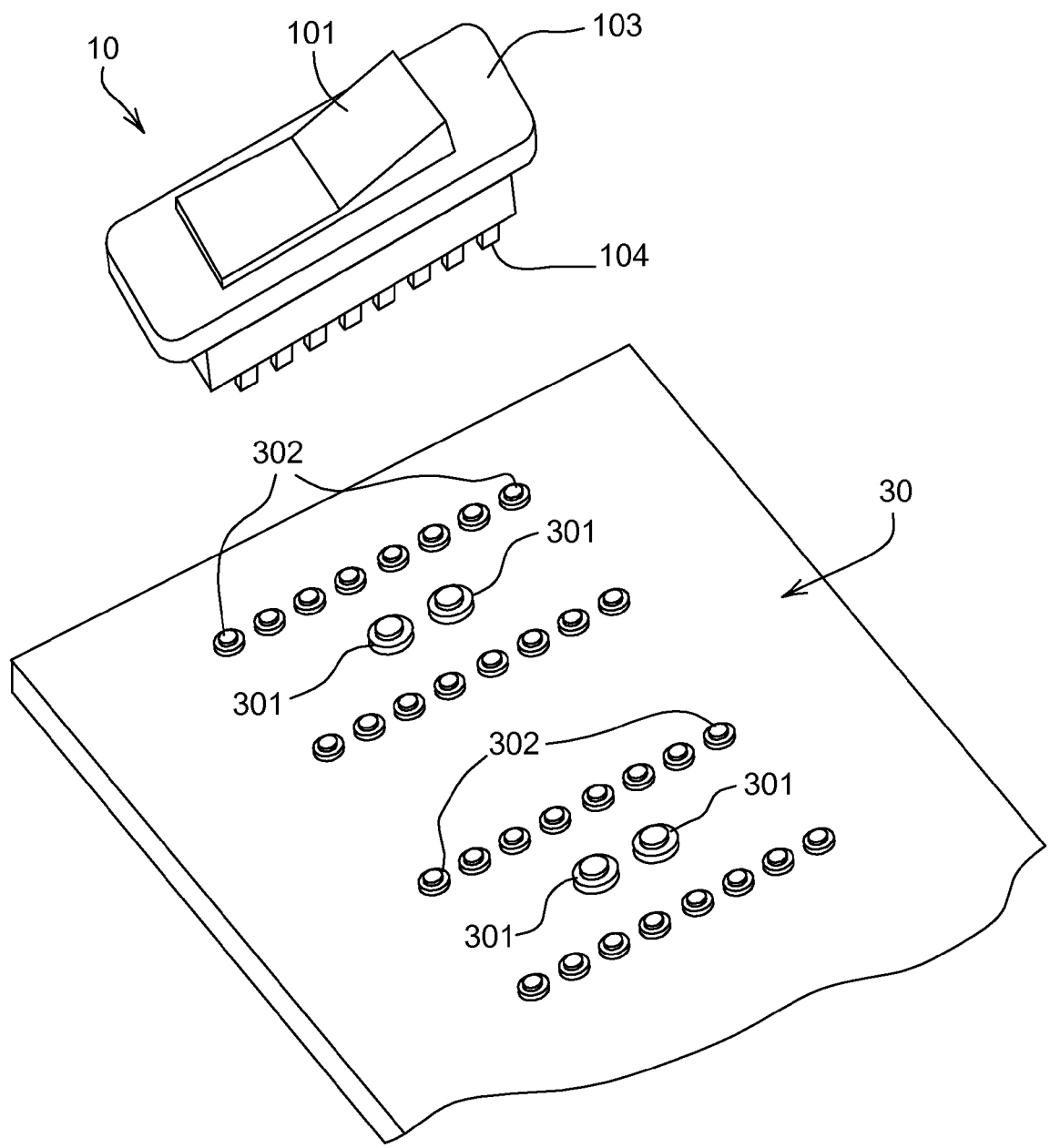
FIG. 4 is a perspective view of the operator control and circuit board with electronic components of FIGS. 1 and 2, with the panel cover removed to show the interface.

Referring now to FIGS. 2, 3, and 4, when the operator control 10 is mounted in one of the cut-outs 201 in the panel cover 20, the projecting members 104 on the bottom surface of the operator control enclosure 103 come in contact with the control ID sensors 302 on the printed circuit board 30. The control ID sensors 302 corresponding to the location of each of the projecting members 104 are activated. In this way, each unique configuration of projecting members 104 will activate a unique subset of the controls ID sensors 302. The activated subset of control ID sensors 302 provides a unique electronic identification for each operator control 10 installed.

In one embodiment, functional sensors 301 comprise one or more switches (e.g., an electronic switch), where each switch closes or opens based upon the movement and position of the control mechanism 102. In one embodiment, the control ID sensors 302 comprise one or more switches, where each switch closes or opens when engaged by one of the projecting members 104.

FIG. 3 shows three possible configurations of projecting members 104 on three different operator control enclosures 103. However, as can be appreciated based on the description below, there can, be many configurations of projecting members 104. The maximum number of projecting members 104 is limited only by the size of the operator control enclosure 103 and the minimum size and spacing requirements of the corresponding control ID switches 302. The minimum number of projecting members 104 is zero. An operator control enclosure 103 with zero projecting members 104 would activate none of the corresponding control ID switches 302. A design for an operator control enclosure 103 featuring a maximum of eight projecting members 104 would be capable of generating $2^8$ unique control identifiers, ranging from 0 (no projecting members 104 populated) to 256 (with all projecting members 104 populated). Increasing the number of projecting members to 10 would offer $2^{10}$ or 1,024 unique identifiers.

The preferred method for producing operator control enclosures 103 with a varying number of projecting members 104 is to create a "template" operator control enclosure 103 with all projecting members 104 populated. A secondary process could then be used to remove the unwanted projecting members 104. This process may be a clipping operation which cuts off selected projecting members 104 or a grinding operation which does the same. Another option for creating the unique operator control enclosure 103 would be for the projecting members 104 to be separate components which must be installed in matching receptacles on the operator control enclosure 103. This method is less desirable as it requires an additional step to populate the correct number and arrangement of projecting members 104, and introduces a new potential failure point in the production process (i.e., projecting members 104 could fall out or be populated incorrectly). Creating a unique mold for every possible arrangement of projecting members 104 is impractical because of the high number of molds required for even a small number of projecting members 104.

Having described the preferred embodiment, it will become apparent that various modifications can be made without departing from the scope of the invention as defined in the accompanying claims. In particular, there are many types of operator controls 103 besides the embodiments described herein. Also, instead of having members 104 that project out from the bottom of the operator controls 103 to activate the control ID sensors 302, it would be possible to embed a material such as metal inside the operator control enclosure 103 such that the material activates a corresponding sensor 302 on the circuit board 30. This is a more complex solution than simply offering projecting members, and therefore less desirable.

What is claimed:

1. An assembly comprising:
   at least one operator control device;
   a panel cover with at least one opening for receiving and mounting the operator control device;
   circuit board underlying the panel cover, the circuit board comprising at least one functional switch and at least one identification, switch;
   the operator control device comprising an enclosure having a selectable number of projecting members extending from a bottom surface of the enclosure, an operator control interface for moving a control mechanism housed in the enclosure, the operator control interface operable the position the control mechanism such that it operatively engages the at least one functional switch; and the opening in the panel cover holding the operator control in position above the circuit board such that the projecting members of the enclosure operatively engage the at least one identification switch on the circuit board, the number and arrangement of the projecting members mechanically engaging a subset of the at least one identification switch to activate the at least one identification switch indicative of an electronic identification for the operator control device.

2. The assembly of claim 1, wherein the at least one functional switch comprises a plurality of electronic switches, each switch closing or opening based upon the movement and position of the control mechanism.

3. The assembly of claim 1, wherein the at least one identification switch comprises a plurality of electronic switches, each switch closing when engaged by one of the projecting members.

4. The assembly of claim 1, wherein the selectable number of projecting members is zero.

5. The assembly of claim 1, wherein the operator control device comprises a rocker switch.

6. The assembly of claim 5, wherein the operator control interface comprises a switch cap covering the rocker switch.

7. The assembly of claim 1, further comprising the projecting members mechanically engaging, without electrically contacting, a subset of the at least one identification switch to activate the at least one identification switch.

\* \* \* \* \*